United States Patent
Yang et al.

(10) Patent No.: US 9,224,949 B2
(45) Date of Patent: Dec. 29, 2015

(54) MEMRISTIVE ELEMENTS THAT EXHIBIT MINIMAL SNEAK PATH CURRENT

(75) Inventors: Jianhua Yang, Palo Alto, CA (US); Minxian Max Zhang, Mountain View, CA (US); R. Stanley Williams, Portola Valley, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 98 days.

(21) Appl. No.: 14/001,835

(22) PCT Filed: Feb. 28, 2011

(86) PCT No.: PCT/US2011/026532
§ 371 (c)(1),
(2), (4) Date: Aug. 27, 2013

(87) PCT Pub. No.: WO2012/118481
PCT Pub. Date: Sep. 7, 2012

(65) Prior Publication Data
US 2013/0334485 A1    Dec. 19, 2013

(51) Int. Cl.
*H01L 45/00* (2006.01)
*H01L 27/06* (2006.01)
*H01L 27/10* (2006.01)
*H01L 27/24* (2006.01)

(52) U.S. Cl.
CPC .......... *H01L 45/145* (2013.01); *H01L 27/0688* (2013.01); *H01L 27/101* (2013.01); *H01L 27/2481* (2013.01); *H01L 45/08* (2013.01); *H01L 45/1233* (2013.10); *H01L 45/146* (2013.01)

(58) Field of Classification Search
None
See application file for complete search history.

(56) References Cited

U.S. PATENT DOCUMENTS 8,519,372 B2 *   8/2013   Yang et al. .................. 257/2
2008/0304307 A1  12/2008  Gopalakrishnan
(Continued)

FOREIGN PATENT DOCUMENTS

| WO | WO-2008-108822 | 9/2008 |
| WO | WO-2010-085227 | 7/2010 |
| WO | WO-2010-117355 | 10/2010 |

OTHER PUBLICATIONS

Lee et al. ("Low-Temperature-Grown Transition Metal Oxide Based Storage Materials and Oxide Transistors for High-Density Non-Volatile Memory", Advanced Functional Materials, pp. 1587-1593, 2009).*

(Continued)

*Primary Examiner* — Yasser A Abdelaziez
(74) *Attorney, Agent, or Firm* — Hewlett Packard Enterprise Patent Department

(57) ABSTRACT

Memristive elements are provided that include an active region disposed between a first electrode and a second electrode, the active region including two switching layers formed of a switching material capable of carrying a species of dopants and a conductive layer formed of a dopant source material. Memristive elements also are provided that include two active regions disposed between a first electrode and a second electrode, and a third electrode being disposed between and in electrical contact with both of the active regions. Each of the active regions include a switching layer formed of a switching material capable of carrying a species of dopants and a conductive layer formed of a dopant source material. Multilayer structures including the memristive elements also are provided.

6 Claims, 6 Drawing Sheets

(56) References Cited

U.S. PATENT DOCUMENTS

| | | |
|---|---|---|
| 2008/0316808 A1 | 12/2008 | Herner et al. |
| 2009/0207645 A1 | 8/2009 | Parkinson |
| 2009/0279349 A1 | 11/2009 | Shih et al. |

OTHER PUBLICATIONS

Biju, Kuyyadi P., et al. "Asymmetric bipolar resistive switching in solution-processed Pt/TiO2/W devices." Journal of Physics D: Applied Physics 43.49 (2010): 495104.

'Green chips' for tomorrow's computers, Public Service Review: Science and Technology: issue 7, pp. 32-33.

International Search Report, Dec. 20, 2011. PCT Patent Application No. PCT/US2011/026532.

JP, Sung Hyun, et al. "Nanoscale memristor device as synapse in neuromorphic systems." Nano letters 10.4 (2010): 1297-1301.

Liang, Jiale, et al.. "Cross-point memory array without cell selectors—Device characteristics and data storage pattern dependencies." Electron Devices, IEEE Transactions on 57.10 (2010): 2531-2538.

Vontobel, Pascal O., et al. "Writing to and reading from a nano-scale crossbar memory based on memristors." Nanotechnology 20.42 (2009): 425204.

* cited by examiner

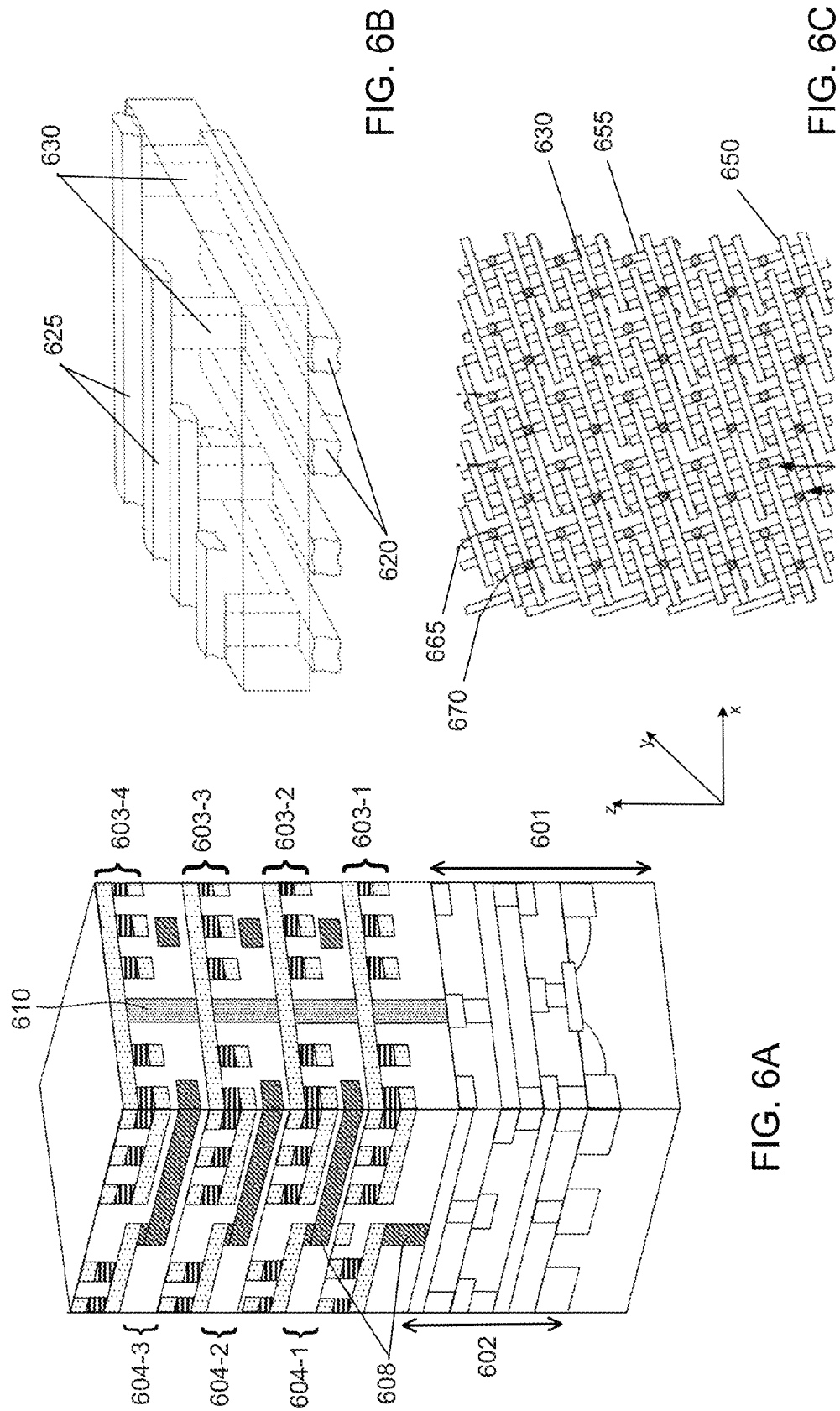

MEMRISTIVE ELEMENTS THAT EXHIBIT MINIMAL SNEAK PATH CURRENT

BACKGROUND

Three-dimensional (3D) circuits containing stacked, multiple layers of interconnected circuitry provide potential solutions for increasing the performance and planar density of integrated circuits. An example of such a 3D circuit is a memory circuit that is comprised of multiple layers of interconnected memristive elements, each layer being an interconnected two-dimensional array (2D) of the memristive elements. Memristive elements having electronic properties that facilitate targeted application of read and write operations to an individual memristive element in a 3D circuit, with minimal sneak current through neighboring memristive elements, would be beneficial.

BRIEF DESCRIPTION OF THE DRAWINGS

The accompanying drawings illustrate various embodiments of the principles described herein and are a part of the specification. The illustrated embodiments are merely examples and do not limit the scope of the claims.

FIG. 6A illustrates another example multilayer structure that includes an array of memristive elements.

FIG. 6B illustrates a perspective view of the example multilayer structure of FIG. 6A.

FIG. 6C illustrates a top view of the example multilayer structure of FIG. 6A.

Throughout the drawings, identical reference numbers designate similar, but not necessarily identical, elements.

DETAILED DESCRIPTION

In the following description, for purposes of explanation, numerous specific details are set forth in order to provide a thorough understanding of the present systems and methods. It will be apparent, however, to one skilled in the art that the present apparatus, systems and methods may be practiced without these specific details. Reference in the specification to "an embodiment," "an example" or similar language means that a particular feature, structure, or characteristic described in connection with the embodiment or example is included in at least that one embodiment or example, but not necessarily in other embodiments or examples. The various instances of the phrases "in one embodiment," "in one example," or similar phrases in various places in the specification are not necessarily all referring to the same embodiment or example.

A "computer" is any machine, device, or apparatus that processes data according to computer-readable instructions that are stored on a computer-readable medium either temporarily or permanently. A "software application" (also referred to as software, an application, computer software, a computer application, a program, and a computer program) is a set of instructions that a computer can interpret and execute to perform one or more specific tasks. A "data file" is a block of information that durably stores data for use by a software application.

The term "computer-readable medium" refers to any medium capable storing information that is readable by a machine (e.g., a computer). Storage devices suitable for tangibly embodying these instructions and data include, but are not limited to, all forms of non-volatile computer-readable memory, including, for example, semiconductor memory devices, such as EPROM, EEPROM, and Flash memory devices, magnetic disks such as internal hard disks and removable hard disks, magneto-optical disks, DVD-ROM/RAM, and CD-ROM/RAM.

As used herein, the term "includes" means includes but not limited to, the term "including" means including but not limited to. The term "based on" means based at least in part on.

Figure 1:
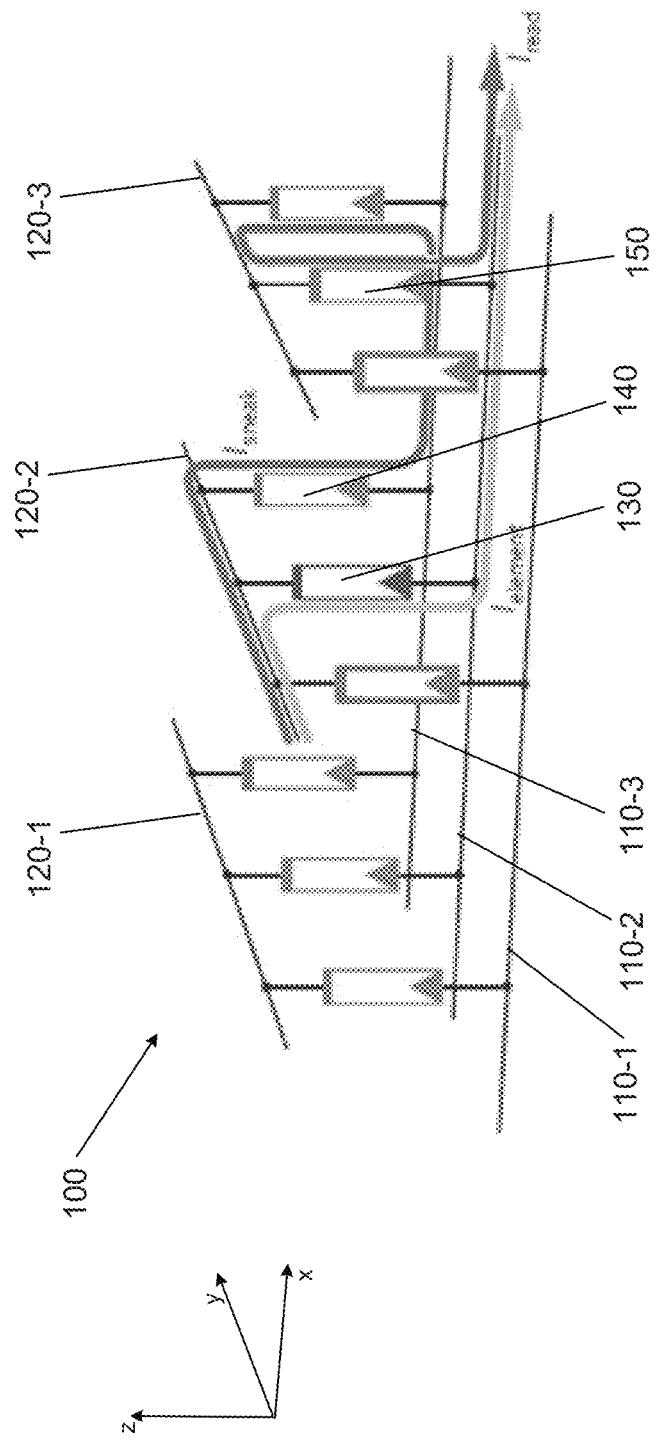
FIG. 1 illustrates an example arrangement of memristive elements.

FIG. 1 illustrates an example two-dimensional arrangement (x-y plane) of memristive elements 100. The memristive elements 100 can be a portion of a multilayer structure, such as a 3D circuit, with additional layers of the 2-D arrangement stacked in the z-direction. Each memristive element in the multilayer structure is disposed at an intersection of two sets of conductive lines 110, 120. The example of FIG. 1 illustrates three of each set of conductive lines 110-i, 120-i (i=1, 2, 3, . . . ). To operate memristive element 130, including to switch memristive element 130 or read the state of memristive element 130, a potential is applied across conductive lines 110-2 and 120-2. A voltage of sufficient magnitude to switch a memristive element is referred to as a "write" voltage. For example, to apply a total of 1.0V across memristive element 130, 0.5V is applied to conductive line 110-2 and −0.5V is applied to conductive line 120-2. Since other memristive elements also make electronic contact with conductive line 110-2 or conductive line 120-2, these neighboring memristive elements also see a voltage of magnitude 0.5V. For example, neighboring memristive element 140 is subjected to −0.5V, while neighboring memristive element 150 is subjected to 0.5V. These neighboring memristive elements are referred to as half-selected devices. There is a risk that the half-selected devices are switched at the potential applied to them, which is an undesirable result since it affects the stability of the multilayer structure in operation. As depicted in FIG. 1, the 1.0V applied across target memristive element 130 causes a current of magnitude $I_{element}$ to flow through target memristive element 130. The −0.5V applied across half-selected memristive element 140 causes a current of magnitude $I_{sneak}$ to flow through memristive element 140. The current of the half-selected devices $I_{sneak}$ is i referred to as the sneak path current. As depicted in FIG. 1, the total read current ($I_{read}$) includes $I_{element}$ and $I_{sneak}$. The total sneak current (total $I_{sneak}$) through all the neighboring half-selected devices, when taken together, may be higher than the current though the target memristive element ($I_{element}$). It would be beneficial to have minimal sneak path current through the half-selected device. The memristive elements provided herein exhibit minimal sneak path current when they are half-selected devices. The memristive elements provided herein also exhibit reduced tendency of being switched at the half potentials applied to them as half-selected devices.

Figure 2:
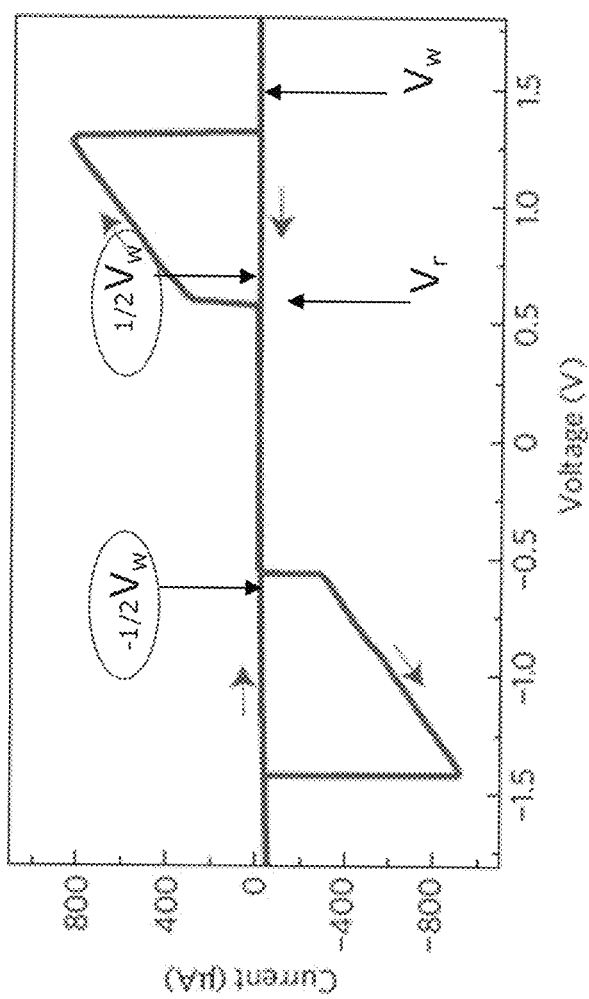
FIG. 2 illustrates an example current-voltage curve.

FIG. 2 shows a current-voltage (I-V) curve for an example memristive device. This example device is switched at a write voltage ($V_w$) of about 1.5V to encode information on the device, and is read at a read voltage ($V_r$) of about 0.6V to probe the encoded state of the device. The write voltage switched the memristive element between two different resistance states, which can be deemed a "0" and a "1" state. The value of $V_w$ applied to switch (i.e., write to) the target memristive element may also have the undesired effect of switching the neighboring half-selected devices (i.e., the voltage ½$V_w$ may be high enough to switch the half-selected devices). Also, the value of the read voltage ($V_r$) applied to probe the state of the target memristive element in a read operation may destructively read the target memristive element, i.e., may switch the device state during reading. This can significantly increase the complexity of the reading operation for this type of device. For those devices with a more linear current-voltage relation, in order to prevent the sneak current, a selective element, such as transistors or diodes, may be used. However, introducing these selective elements within an arrangement of the memristive elements increases the complexity and expense of fabricating an arrangement of memristive elements, and limits scaling of any multilayer structure.

The memristive elements provided herein possess current-voltage properties that facilitate targeted application of potentials (i.e., a read voltage or a write voltage) to individual memristive elements in a multilayer structure with minimal sneak current through neighboring memristive elements (i.e., the half-selected devices). That is, the current-voltage properties of the memristive elements provided herein are such that a potential can be applied to a given memristive element in the 3D circuit with little activation of neighboring memristive elements in the multilayer structure.

Figure 3:
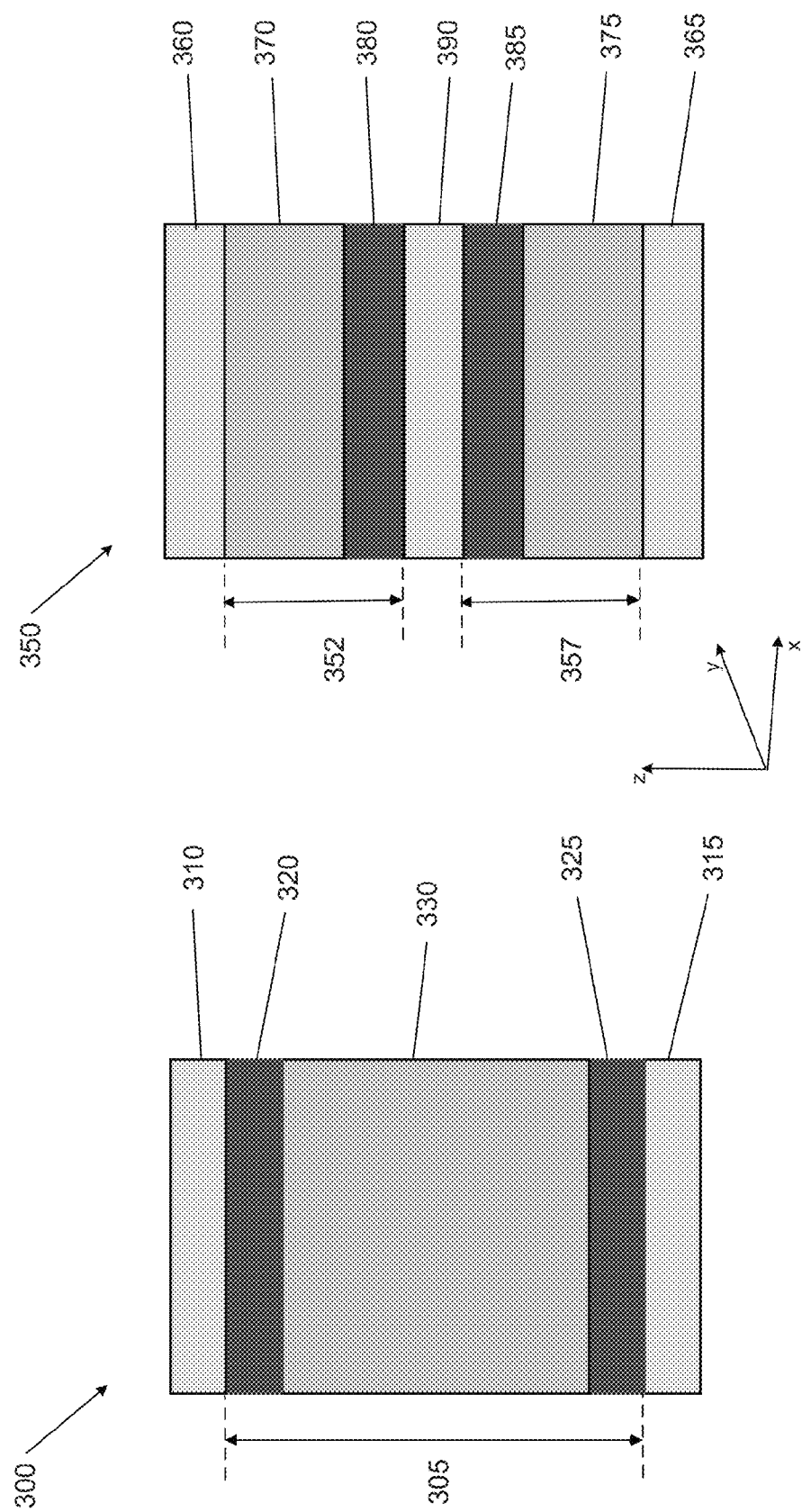
FIGS. 3A and 3B illustrate examples of memristive elements.

FIG. 3A shows an example memristive element 300 according to principles described herein. The memristive element 300 includes an active region 305 disposed between a first electrode 310 and a second electrode 315. The active region 305 including two switching layers 320, 325 and a conductive layer 330 formed of a dopant source material. The switching layers 320, 325 are each formed of a switching material capable of carrying a species of dopants and transporting the dopants under an applied potential. The conductive layer 330 is disposed between and in electrical contact with the switching layers 320, 325. Conductive layer 330 is formed of a dopant source material that includes the species of dopants that are capable of drifting into the switching layers under the applied potential and thus changing the conductance of memristive element 300.

FIG. 3B shows another example memristive element 350 according to principles described herein. The memristive element 350 includes two active regions 352, 357 disposed between a first electrode 360 and a second electrode 365. Each of the active regions 352, 357 includes a switching layer 380, 385 formed of a switching material capable of carrying a species of dopants and a conductive layer 370, 375 formed of a dopant source material. A third electrode 390 is disposed between and in electrical contact with both of the active regions 352, 357.

When a potential is applied to memristive element 300 or memristive element 350 in a first direction (such as in the positive z-axis direction), one of the switching layers (a first switching layer) develops an excess of the dopants and the other switching layer (a second switching layer) develops a deficiency of the dopants. When the direction of the potential is reversed the voltage potential polarity is reversed, and the drift direction of the dopants is reversed. The first switching layer develops a deficiency of dopants and the second switching layer develops an excess of dopants.

Typically, the switching material is an electronically insulating, semiconducting, or a weak ionic conductor. For example, the switching material can be a highly insulating stoichiometric compound. Examples of the switching material include a carbonate of silicon (including $SiCO_4$), an oxide of aluminum, an oxide of titanium (including $TiO_2$), an oxide of silicon (including $SiO_2$), an oxide of gallium, an oxide of germanium, and an oxide of a transition metal (including oxides of Sc, Ti, V, Cr, Mn, Fe, Co, Ni, Cu, Zn, Y, Zr, Nb, Mo, Hf, Ta, W, or Re). Other examples of the switching material include a nitride of aluminum (including AlN), a nitride of silicon, a nitride of gallium, a nitride of germanium, and a nitride of a transition metal (including nitrides of Sc, V, Cr, Mn, Fe, Co, Ni, Cu, Zn, Y, Zr, Nb, Mo, Hf, and Re).

The dopant source material is the source of the doping species for the switching material. That is, the dopant source material includes a relatively high concentration of dopants of the type that can be transported by the switching material. For example, the dopant source material may be the same as the switching material but with a concentration of dopants. Examples of dopant source material include titanium sulphide, titanium phosphide, $Ti_4O_7$, $TiO_{2-x}$ ($0<x<1$), $AlN_{1-w}$ ($0<w<0.2$), a ternary system (e.g., $SrTiO_{1-y}$ ($0<y<0.2$)), or a quaternary system. The type of dopant depends on the type of dopant source material and switching material used. For example, in a system where the dopant source material $AlN_{1-w}$ is used with switching material AlN, the dopant is nitrogen vacancies. As another example, where the dopant source material is $Ti_4O_7$, the dopant is oxygen vacancies.

The thickness of the switching layer in some examples can be about 10 nm or less, about 6 nm or less, about 4 nm or less, about 2 nm or less, or less than 1 nm. For example, the thickness of the switching layer can be about 0.5 nm or less. The conductive layer can be about the same thickness as the switching layer, or can be thicker than the switching layer. For example, the thickness of the conductive layer may range from 2 nm to 200 nm. Either of the electrodes can be made of platinum between about 7 nm and about 100 nm thick, or thicker. In another example, the electrode can be a copper/tantalum nitride/platinum system, where the copper is a very good conductor, and the tantalum nitride acts as a diffusion barrier between the copper and the platinum.

Figure 4:
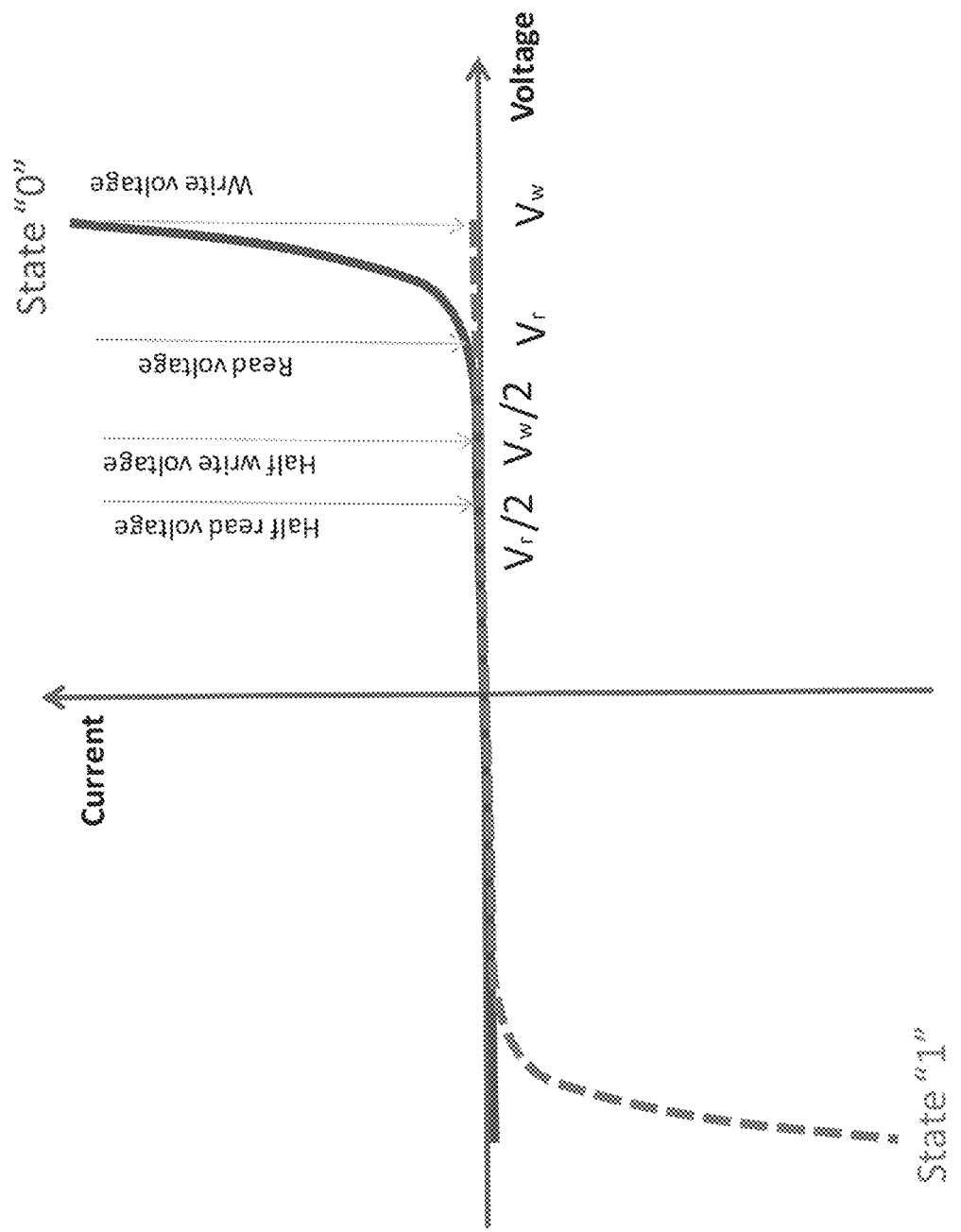
FIG. 4 illustrates an example current-voltage curve.

FIG. 4 shows an example current-voltage (I-V) characteristic of memristive elements according to principles described herein (including FIGS. 3A and 3B). FIG. 4 shows the current-voltage (I-V) curve when the memristive element is in the "0" state (the first resistance state of the memristive element), and the current-voltage (I-V) curve when the memristive element is in the "1" state (the second resistance state of the memristive element). The graph shows that, when a write voltage ($V_w$) is applied to a target memristive element, the voltage ½$V_w$ applied to the neighboring half-selected devices draws only minimal current. That is, any sneak current that may flow through half-selected devices would be minimal. The value of the read voltage ($V_r$) applied to probe the state of the target memristive element in a read operation does not destructively read the target memristive element. As FIG. 4 shows, the amount of current at $V_r$ is minimal. As FIG. 4 also shows, any amount of sneak current at ½$V_r$, the voltage seen by half-selected devices, is similarly minimal. That is, the sneak current ($I_{sneak}$) through a half-selected device is smaller than the current through the targeted memristive element by a factor of more than two. For example, the sneak current through a half-selected device can be smaller than the current through the targeted memristive element by a factor of about 2.5, about 3, about 5, about 8, about 10 or more. The total sneak current ($I_{sneak\ total}$) through all the neighboring half-selected devices, when taken together, would be small. Given that the sneak current ($I_{sneak}$) is minimal, the total read current may closely approximate the read current from the targeted memristive element ($I_{read} \sim I_{element}$) if the sneak current is kept sufficiently minimal. The memristive elements provided herein also exhibit reduced tendency of being switched at the half potentials applied to them as half-selected devices.

To prevent the sneak path current through the half-selected devices, memristive elements with sufficient nonlinearity in both the ON ("1") and OFF ("0") states are provided. Only negligible current flows through the unselected or half-selected devices. In these devices, the both "1" and "0" states are a rectifier, but with opposite rectifying directions. The conductance ratio of "1" and "0" is very large at the read voltage, while "1" and "0" states are both very resistive at the half of the read or write voltages, thus significantly reducing or preventing the sneak path current. The switching of the memristive elements of FIGS. 3A and 3B is similar to a reverting diode that changes its rectifying direction under a voltage pulse. At lower voltages, such as the half of the read or write voltages, all the devices are sufficiently resistive but with negligible current, so there is very little sneak path current. For reading a target memristive element, a large resistance difference can be detected with a higher voltage, such as with applying the read voltage.

Since the sneak path current is significantly reduced, no selective element, such as a transistor, is needed. As a result, the complexity and expense of fabricating an arrangement of these memristive elements into larger, more complex multilayer structures is reduced. The memristive elements are highly scalable and stackable. Since the sneak path currents are limited, the size of array of the memristive elements can be large. The memristive elements can be scaled down to scales below 10 nm and can be stack in multilayer structures (including 3D structures).

Figure 5:
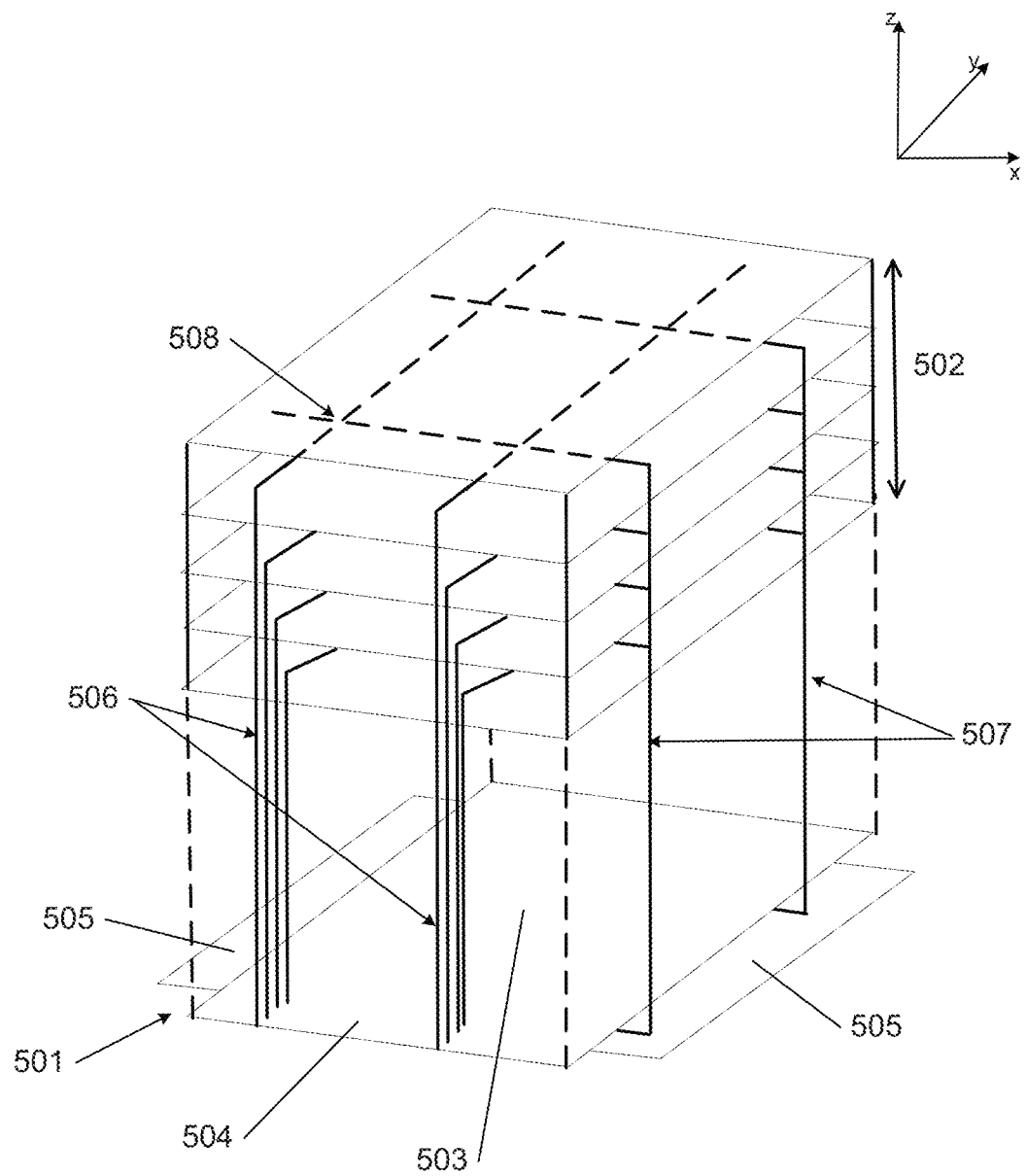
FIG. 5 illustrates an example multilayer structure that includes an array of memristive elements.

Multilayer structures including the memristive elements also are provided. FIG. 5 illustrates an example of a multilayer structure (such as but not limited to a memory circuit) to which the principles described herein are applicable. The multilayer structure is comprised of interconnected memristive elements arranged in a 3D architecture. The multilayer structure is configured as a base on which a memory circuit 502 is laminated, with conductive lines 506, 507 leading from the base to each layer of the multilayer structure. The example of FIG. 5 shows a multilayer structure having edge-disposed conductive lines 506 and 507. Memristive elements 508 are positioned in each 2D array on each layer at the intersection of conductive lines 506 and 507. Conductive lines 506, 507 provide electrical connectivity between the memristive elements and the base. The base includes a semiconductor substrate 501, a wiring area 503 (such as formed from CMOS circuitry), and contact areas 504 and 505 for the conductive lines. Conductive lines 506 and 507 connect each layer of interconnected memory cells to the wiring area 503 formed on the semiconductor substrate 501. Contact areas 504 and 505 are provided along four edges of the wiring area 503. The memory circuit 502 is illustrated as having four layers of 2D arrays of the interconnected memristive elements. However, the memory circuit can include more or fewer than four layers of 2D arrays. The wiring area 503 is provided in the semiconductor substrate 501 below the memory circuit 502. In the wiring area 503, a global bus or the like is used for providing instructions for writing (i.e., putting memristive elements to ON or OFF states) or reading from the circuit 502 with outside sources. That is, the external voltage is applied to memristive element(s) using conductive lines 506 and 507. In some examples, wiring area 503 includes a column control circuit including a column switch and/or a row control circuit including a row decoder. The base can be integrated with complementary metal-oxide-semiconductor (CMOS) or other conventional computer circuitry. The CMOS circuitry can be configured to selectively address, including applying the potential, to the targeted memristive element(s). For example, the CMOS circuitry can be used to apply the read and write voltages to the conductive lines as described above. This CMOS circuitry can provide additional functionality to the multilayer structure such as input/output functions, buffering, logic, or other functionality.

FIG. 5 shows one multilayer structure obtained by laminating a plurality of interconnected memory cells in a direction perpendicular to the semiconductor substrate 501 (z direction shown in FIG. 5). However, an actual structure can include a plurality of multilayer structures arranged in a matrix form in the longitudinal x-direction and/or in the longitudinal y-direction (shown in FIG. 5).

In the example of FIG. 5, conductive lines 506 can be driven independently using the external applied voltage in each layer and conductive lines 507 in all layers are illustrated as connected in common. However, it is also contemplated that conductive lines 507 may be driven independently in each layer using the external applied voltage. Alternatively, conductive lines 506 may be connected in common and conductive lines 507 may be driven independently using the external applied voltage. Further, at least one of conductive lines 506 and conductive lines 507 may be shared by upper and lower layers of the multilayer structure. The CMOS circuitry can be configured to selectively address (including applying external voltages to) ones of the memristive elements (the targeted memristive elements) using the conductive lines 506, 507.

An example multilayer structure according to the principles of FIG. 5 includes a base and a multilayer circuit disposed above the base. The multilayer circuit includes a plurality of the memristive elements depicted in FIG. 3A and/or FIG. 3B. Conductive lines lead from the base to the plurality of memristive elements. Each memristive element is disposed at an intersection of the conductive lines. In an example, the base includes CMOS circuitry that is used to apply a voltage to a target memristive element for a read operation or a write operation. The current through the target memristive element at the applied voltage is greater than the current though a neighboring half-selected memristive element by a factor of more than two.

FIG. 6A illustrate another example of a multilayer structure to which the principles described herein are applicable. The multilayer structure 600 includes a base 601 and a multilayer circuit disposed above the base. The base includes a CMOS layer 602. The multilayer circuit includes layers of interconnected memristive elements, each layer being formed as a 2D crossbar array 603-i (1=1, ..., 4). FIG. 6B illustrates a portion of a 2D crossbar array composed of a lower layer of approximately parallel nanowires 620 that are overlain by an upper layer of approximately parallel nanowires 625. The nanowires of the upper layer 625 are roughly perpendicular, in orientation, to the nanowires of the lower layer 620, although the orientation angle between the layers may vary. The two layers of nanowires form a lattice, or crossbar, in which each nanowire of the upper layer 625 overlies all of the nanowires of the lower layer 620. In this example, the memristive elements 630 are formed between the crossing nanowires at these intersections. Consequently, each nanowire 625 in the upper layer is connected to every nanowire 620 in the lower layer through a memristive element and vice versa. FIG. 6C illustrates a top view of the crossbar array, showing a set of upper crossbar wires (650), a set of lower crossbar wires (655), and a number of programmable memristive elements (660) interposed at the intersection between the upper crossbar wires (650) and the lower crossbar wires (655).

Different types of conductive lines form the conductive path that leads from the base to the memristive elements of the crossbar arrays of the example multilayer structure of FIG.

6A. One type of conductive line is wiring layers 604-i (1=1, . . . , 3) that are interposed between successive crossbar arrays 603-i (see FIG. 6A). Another type of conductive line that form the conductive path that connects the crossbar array to the base is two groups of vias 608, 610 (see FIG. 6A). A first group of vias 608 connects to the lower crossbar lines (nanowires 620) and a second group of vias 610 connects to the upper crossbar lines (nanowires 625). The second vias 610 pass through all the crossbar arrays 603-i and wiring layers 604-i as a vertical column. In contrast, the locations of the first vias 608 are shifted in each successive wiring layer 604-i. FIG. 6C also shows a top view of the first vias 665 and second vias 670 in the 2D crossbar array. Portions of the nanowires 620, 625 between the memristive elements also serve as conductive lines. The use of the conductive lines, including the wiring layers 604-i, first vias 608, second vias 610, lower crossbar lines (nanowires 620) and upper crossbar lines (nanowires 625), to uniquely address (including applying voltages to read data and/or to write data (i.e., set to an ON or OFF state)) to the memristive elements in the multilayer structure of FIGS. 6A-C are also described in international application no. PCT/US2009/039666, filed Apr. 6, 2009, titled "Three-Dimensional Multilayer Circuit," which is incorporated herein by reference in its entirety. The CMOS circuitry can be configured to selectively address (including applying external voltages to) ones of the memristive elements using the conductive lines (including the wiring layers 604-i, first vias 608, second vias 610, lower crossbar lines (nanowires 620) and upper crossbar lines (nanowires 625)).

The three dimensional multilayer structures described above could be used in a variety of applications. For example, the multilayer structures could be used as a very high density memory which replaces Dynamic Random Access Memory for computing applications; incorporated into a high density portable storage device that replaces flash memory and other removable storage devices for cell phones, cameras, net book and other portable applications; a very high density storage medium to replace magnetic hard disks and other forms of permanent or semi-permanent storage of digital data; and/or a very high density cache or other memory integrated on top of a computer processor chip to replace Static Random Access Memory. For example, the memristive elements described herein can be used in applications using different types of memory, e.g., capacitor, variable capacitor, floating gate transistor, four transistor feedback loop circuit, or magnetic tunnel junction in commercialized DRAM, FeRAM, NOR flash, SRAM or MRAM, technologies, correspondingly. The read/write operations may not be the same for the different types of memories, but in general, e.g., read involves sensing either the charge of a particular memristive element or passing current through the memristive element.

An example multilayer structure according to the principles of FIGS. 6A, 6B and 6C includes a base and a multilayer circuit disposed above the base. The multilayer circuit includes a plurality of the memristive elements of FIG. 3A and/or FIG. 3B. Conductive lines lead from the base to the plurality of memristive elements. Each memristive element is disposed at an intersection of the conductive lines. In an example, the multilayer structure includes a via array and crossbar arrays configured to overlie the base, where the crossbar arrays form a plurality of intersections, where the memristive elements are each positioned at different intersections, and where the conductive lines leading from the base to each of the memristive element include at least one via, and at least two crossbar lines of the crossbar arrays. In an example, the base includes CMOS circuitry that is used to apply a voltage to a target memristive element for a read operation or a write operation. The current through the target memristive element at the applied voltage is greater than the current though a neighboring half-selected memristive element by a factor of more than two.

The preceding description has been presented only to illustrate and describe embodiments and examples of the principles described. This description is not intended to be exhaustive or to limit these principles to any precise form disclosed. Many modifications and variations are possible in light of the above teaching.

What is claimed is:

1. A memristive element, comprising:
    a first electrode of a nanoscale width; a second electrode of a nanoscale width; and
    an active region disposed between and in electrical contact with the first and second electrodes, wherein:
    the active region having two switching layers formed of a switching material capable of carrying a species dopants of and transporting the dopants under an applied potential and a conductive layer disposed between and in electrical contact with the switching layers, the conductive layer being formed of a dopant source material that includes the species of dopants that are capable of drifting into the switching layers under the applied potential;
    a first switching layer of the two switching layers develops an excess of dopants and a second switching layer of the two switching layers develops a deficiency of dopants when potential is applied in a first direction, and the first switching layer of the two switching layers develops a deficiency of dopants and the second switching layer of the two switching layers develops an excess of dopants when potential is applied in a second direction that is opposite to the first direction.

2. The memristive element of claim 1, wherein the switching material comprises an oxide of aluminum, an oxide of silicon, a carbonate of silicon, an oxide of gallium, an oxide of germanium, or an oxide of a transition metal (including Sc, Ti, V, Cr, Mn, Fe, Co, Ni, Cu, Zn, Y, Zr, Nb, Mo, Hf, Ta, W, and Re).

3. The memristive element of claim 2, wherein the switching material is $TiO_2$ and wherein the dopant source material is $Ti_4O_7$.

4. The memristive element of claim 1, wherein the switching material comprises a nitride of aluminum, a nitride of silicon, a nitride of gallium, a nitride of germanium, or a nitride of a transition metal (including Sc, V, Cr, Mn, Fe, Co, Ni, Cu, Zn, Y, Zr, Nb, Mo, Hf, and Re).

5. The memristive element of claim 4, wherein the switching material is aluminum nitride and the dopant source material is $AlN_{1-w}$, wherein $0<w\leq0.2$.

6. A multilayer structure comprising:
    a base;
    a multilayer circuit disposed above the base, wherein the multilayer circuit comprises a plurality of the memristive elements of claim 1; and
    conductive lines leading from the base to the plurality of memristive elements, wherein each memristive element is disposed at an intersection of the conductive lines.

* * * * *